United States Patent
Takada et al.

(10) Patent No.: US 11,901,920 B2
(45) Date of Patent: Feb. 13, 2024

(54) FRONT-END CIRCUIT, DIVERSITY CIRCUIT, AND COMMUNICATION DEVICE

(71) Applicant: Murata Manufacturing Co., Ltd., Kyoto (JP)

(72) Inventors: Atsushi Takada, Kyoto (JP); Morio Takeuchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 162 days.

(21) Appl. No.: 16/872,781

(22) Filed: May 12, 2020

(65) Prior Publication Data

US 2020/0366322 A1 Nov. 19, 2020

(30) Foreign Application Priority Data

May 13, 2019 (JP) ................................. 2019-090698

(51) Int. Cl.
| | | |
|---|---|---|
| *H04L 12/00* | (2006.01) | |
| *H04B 1/00* | (2006.01) | |
| *H03F 3/24* | (2006.01) | |
| *H03F 3/189* | (2006.01) | |
| *H04B 1/52* | (2015.01) | |

(52) U.S. Cl.
CPC ........... *H04B 1/0057* (2013.01); *H03F 3/189* (2013.01); *H03F 3/24* (2013.01); *H04B 1/0064* (2013.01); *H04B 1/52* (2013.01)

(58) Field of Classification Search
None
See application file for complete search history.

(56) References Cited

U.S. PATENT DOCUMENTS

| | | | | |
|---|---|---|---|---|
| 10,998,924 B2 * | 5/2021 | Tsuda | .................... | H04B 7/0413 |
| 2013/0231064 A1 * | 9/2013 | Gudem | ................ | H04B 1/0057 |
| | | | | 455/73 |
| 2014/0133364 A1 * | 5/2014 | Weissman | ................ | H04B 1/52 |
| | | | | 370/273 |
| 2015/0303973 A1 * | 10/2015 | Wloczysiak | ........... | H04B 1/006 |
| | | | | 455/77 |
| 2016/0127025 A1 * | 5/2016 | Wloczysiak | ......... | H04B 7/0817 |
| | | | | 375/267 |
| 2016/0323080 A1 * | 11/2016 | Khlat | ....................... | H04B 1/38 |
| 2016/0365889 A1 | 12/2016 | Weissman et al. | | |
| 2018/0063031 A1 * | 3/2018 | Wloczysiak | .......... | H04W 40/02 |

FOREIGN PATENT DOCUMENTS

JP       2016-501467 A       1/2016

* cited by examiner

*Primary Examiner* — Noel R Beharry
*Assistant Examiner* — Lionel Preval
(74) *Attorney, Agent, or Firm* — Pearne & Gordon LLP

(57) ABSTRACT

A front-end circuit includes a primary circuit and a diversity circuit, the primary circuit includes transmission paths 51 and 52 for transmitting a signal in a band A and in a band B, respectively. Transmission and reception of a signal in the band B are performed by a TDD system in the transmission path 52. The diversity circuit includes a switch, and reception paths 53 and 54 that receive a signal in the band A and in the band B, respectively. When reception signals in the band A and in the band B are simultaneously transmitted, and when a reception signal in the band A and a transmission signal in the band B are simultaneously transmitted, the switch causes the diversity antenna and each of the reception path 53 and the reception path 54 to be in a conductive state.

11 Claims, 5 Drawing Sheets

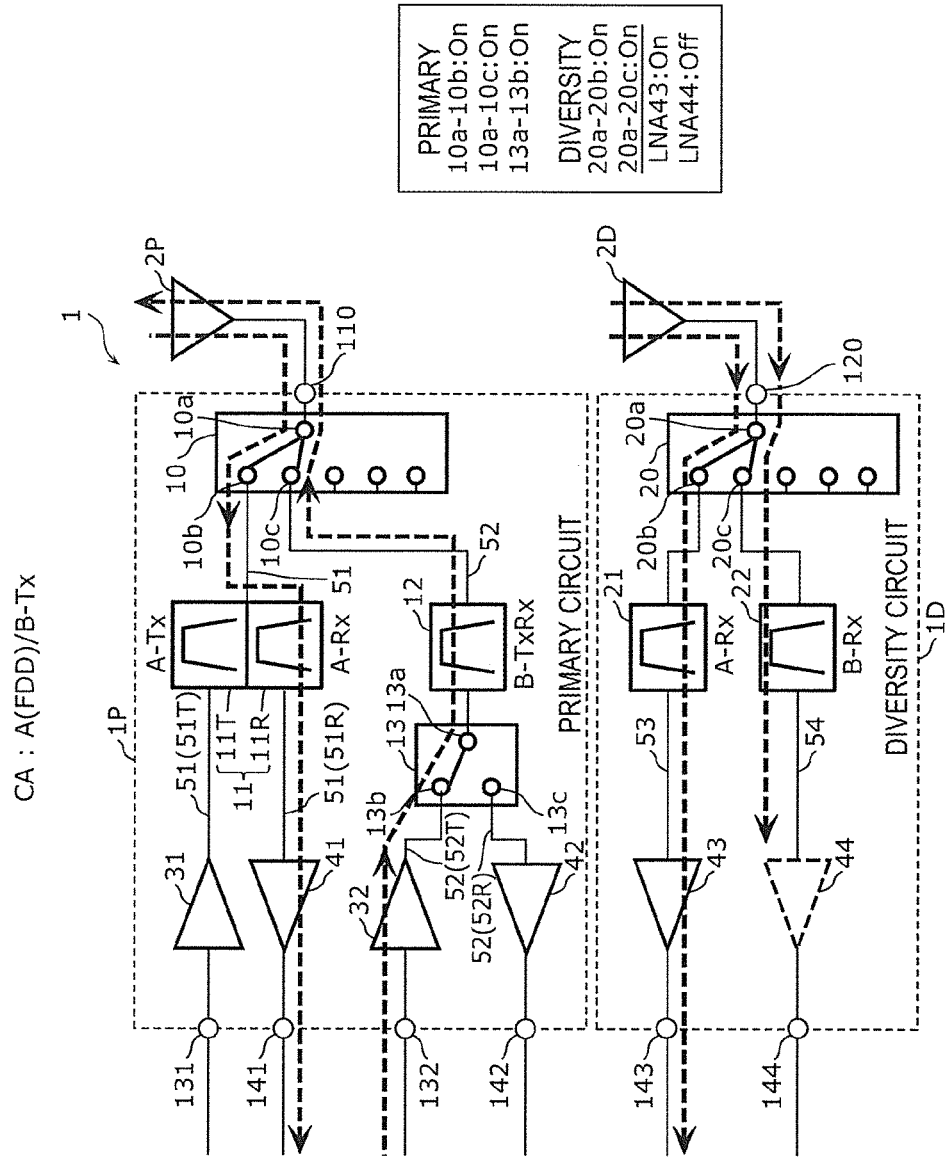

FRONT-END CIRCUIT, DIVERSITY CIRCUIT, AND COMMUNICATION DEVICE

This application claims priority from Japanese Patent Application No. 2019-090698 filed on May 13, 2019. The content of this application is incorporated herein by reference in its entirety.

BACKGROUND

The present disclosure relates to a front-end circuit, a diversity circuit, and a communication device for processing a radio frequency signal. Hitherto, a front-end circuit capable of simultaneously transmitting radio frequency signals in a plurality of communication bands has been required.

Japanese Unexamined Patent Application Publication (Translation of PCT Application) No. 2016-501467 discloses a circuit configuration of a device including a first antenna interface circuit connected to a first antenna and a second antenna interface circuit connected to a second antenna circuit. Each of the first and second antenna interface circuits has a configuration in which a plurality of signal paths for transmitting radio frequency signals in respective communication bands are commonly connected to a switch. According to this configuration, since radio frequency signals in a plurality of communication bands can be transmitted simultaneously by using the respective first and second antenna interface circuits, the device can operate, for example, two uplinks and two downlinks.

In the device described in the above-described Japanese Unexamined Patent Application Publication (Translation of PCT Application) No. 2016-501467, for example, the first antenna interface circuit can be applied to a primary circuit, and the second antenna interface circuit can be applied to a diversity circuit. In this case, in the second antenna interface circuit, a reception path to be activated is selected by the switch corresponding to a reception path which is active in the first antenna interface circuit.

However, when the first antenna interface circuit includes a signal path for performing transmission and reception by a time division duplex system, a connection state of the switch in the second antenna interface circuit changes in response to switching of a transmission mode and a reception mode in the signal path. Due to this change, a phase of the signal transmitted through the active signal path in the second antenna interface circuit changes, resulting in, for example, deterioration in EVM or the like. Therefore, the terminal device including the second antenna interface circuit may not correctly receive data.

BRIEF SUMMARY

Accordingly, the present disclosure provides a front-end circuit, a diversity circuit and a communication device capable of receiving a reception signal with high accuracy in a system capable of simultaneously transmitting radio frequency signals in a plurality of communication bands.

A front-end circuit according to embodiments of the present disclosure includes a primary circuit capable of simultaneously transmitting at least a radio frequency signal in a first communication band and a radio frequency signal in a second communication band, and a diversity circuit configured to receive a radio frequency signal in the first communication band in response to reception of a radio frequency signal in the first communication band in the primary circuit, and configured to receive a radio frequency signal in the second communication band in response to reception of a radio frequency signal in the second communication band in the primary circuit, in which the primary circuit includes a first input/output terminal, a first reception terminal, a second reception terminal, and a second transmission terminal, a first transmission path that is a path connecting the first input/output terminal and the first reception terminal and that is for transmitting a radio frequency signal in the first communication band, and a second transmission path that is a path connecting the first input/output circuit, the second reception terminal and the second transmission terminal and that is for transmitting a radio frequency signal in the second communication band, reception of a radio frequency signal in the second communication band flowing from the first input/output terminal to the second reception terminal and transmission of a radio frequency signal in the second communication band flowing from the second transmission terminal to the first input/output terminal are performed by a time division duplex system in the second transmission path, the diversity circuit includes a first input terminal, a third reception terminal and a fourth reception terminal, a first switch that includes a first selection terminal, a second selection terminal, and a first common terminal connected to the first input terminal and that switches between conduction and non-conduction between the first common terminal and the first selection terminal, and switches between conduction and non-conduction between the first common terminal and the second selection terminal, a first reception path that is connected to the first selection terminal and the third reception terminal and that is for receiving a radio frequency signal in the first communication band from the first input terminal via the first selection terminal to the third reception terminal, and a second reception path that is connected to the second selection terminal and the fourth reception terminal and that is for receiving a radio frequency signal in the second communication band from the first input terminal via the second selection terminal to the fourth reception terminal, and when reception of a radio frequency signal in the first communication band in the first transmission path and reception of a radio frequency signal in the second communication band in the second transmission path in the primary circuit are simultaneously performed, the first switch causes the first common terminal and the first selection terminal to be in a conductive state and causes the first common terminal and the second selection terminal to be in a conductive state, and when reception of a radio frequency signal in the first communication band in the first transmission path and transmission of a radio frequency signal in the second communication band in the second transmission path in the primary circuit are simultaneously performed, the first switch causes the first common terminal and the first selection terminal to be in a conductive state and causes the first common terminal and the second selection terminal to be in a conductive state.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 2A is a circuit state diagram of the front-end circuit according to the embodiment in a first carrier aggregation (CA) state;

DETAILED DESCRIPTION

Figure 1:
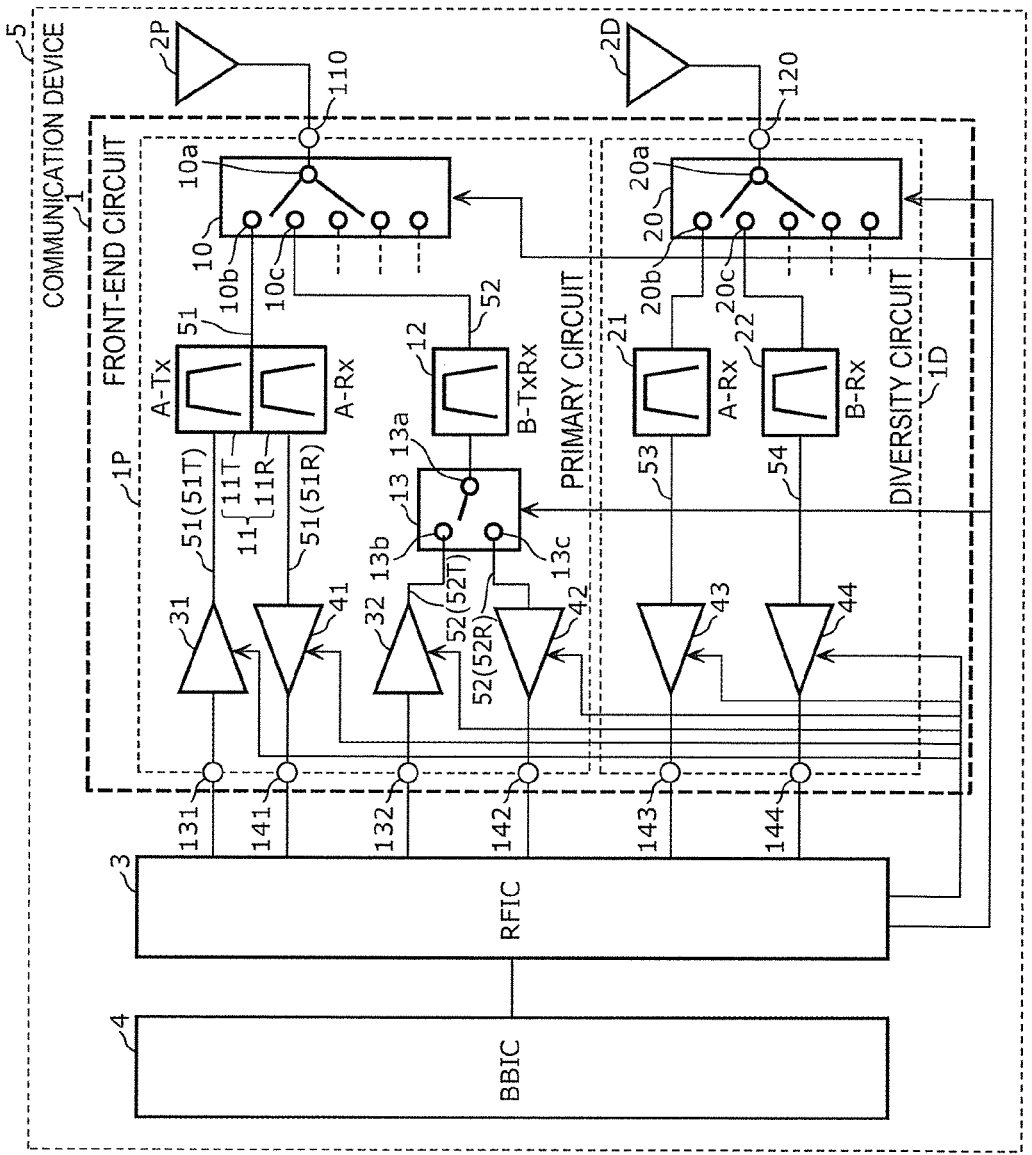
FIG. 1 is a circuit configuration diagram of a front-end circuit and a communication device according to an embodiment of the present disclosure.

Hereinafter, embodiments of the present disclosure will be described in detail with reference to examples and drawings. The embodiments described below are all inclusive or specific examples. The numerical values, shapes, materials, constituent elements, arrangement and connection configurations of the constituent elements, and the like shown in the following embodiments are examples, and are not intended to limit the present disclosure. Among the constituent elements in the following embodiments, the constituent elements not described in the independent claims will be described as arbitrary constituent elements. Also, the sizes or the ratio of the sizes of the constituent elements shown in the drawings are not necessarily critical.

Embodiment

1. Configuration of Front-End Circuit 1 and Communication Device 5

FIG. 1 is a circuit configuration diagram of a front-end circuit 1 and a communication device 5 according to the embodiment. As shown in the figure, the communication device 5 includes the front-end circuit 1, a primary antenna 2P and a diversity antenna 2D, an RF signal processing circuit (RFIC) 3, and a baseband signal processing circuit (BBIC) 4.

The RFIC 3 is an RF signal processing circuit for processing a radio frequency signal to be transmitted and a radio frequency signal received by the primary antenna 2P and the diversity antenna 2D. Specifically, the RFIC 3 performs signal processing on a radio frequency reception signal input through the front-end circuit 1 by down-conversion or the like, and outputs the reception signal generated by performing the signal processing to the BBIC 4. Additionally, the RFIC 3 performs signal processing on a transmission signal input from the BBIC 4 by up-conversion or the like, and outputs the radio frequency transmission signal generated by the signal processing to the front-end circuit 1.

The BBIC 4 is a circuit that performs signal processing by using an intermediate frequency band having frequencies lower than a frequency of the radio frequency signal transmitted through the front-end circuit 1. The signal processed in the BBIC 4 is used, for example, as an image signal for image display, or as an audio signal for a phone call through a speaker.

The RFIC 3 also has a function as a control unit for controlling connection switching of switches 10, 13, and 20 included in the front-end circuit 1, and amplification and stop of power amplifiers 31 and 32, low-noise amplifiers 41, 42, 43, and 44, based on selection of a communication band to be used and selection of a transmission mode and a reception mode. Note that the control unit may be provided outside the RFIC 3, or may be provided in the front-end circuit 1 or the BBIC 4.

Next, a detailed configuration of the front-end circuit 1 will be described.

As shown in FIG. 1, the front-end circuit 1 includes a primary circuit 1P and a diversity circuit 1D.

The primary circuit 1P has a configuration capable of simultaneously transmitting at least a radio frequency signal in a band A (first communication band) and a radio frequency signal in a band B (second communication band).

The diversity circuit 1D receives a radio frequency signal in the band A in response to reception of a radio frequency signal in the band A in the primary circuit 1P, and receives a radio frequency signal in the band B in response to reception of a radio frequency signal in the band B in the primary circuit 1P. When the diversity circuit 1D receives the same radio frequency signal as a radio frequency signal received by the primary circuit 1P, it becomes possible to preferentially use the radio frequency signal from the antenna having a better radio wave condition of the above-described radio frequency signals received by the primary antenna 2P and the diversity antenna 2D in the communication device 5, or to eliminate noise by synthesizing the radio frequency signals received by the two antennas that are the primary antennas 2P and the diversity antenna 2D. That is, the diversity circuit 1D is a circuit for improving communication quality and communication reliability in the communication device 5.

Detailed configurations of the primary circuit 1P and the diversity circuit 1D will be described below.

The primary circuit 1P includes a transmission/reception terminal 110, transmission terminals 131 and 132, reception terminals 141 and 142, transmission paths 51 and 52, switches 10 and 13, a duplexer 11, a transmission/reception filter 12, the power amplifiers 31 and 32, and the low-noise amplifiers 41 and 42.

The transmission/reception terminal 110 is an example of the first input/output terminal, the transmission terminal 132 is an example of the second transmission terminal, the reception terminal 141 is an example of the first reception terminal, and the reception terminal 142 is an example of the second reception terminal.

The transmission path 51 is an example of the first transmission path, includes a transmission path 51T connecting the transmission/reception terminal 110 and the transmission terminal 131, and a reception path 51R connecting the transmission/reception terminal 110 and the reception terminal 141, and transmits a radio frequency signal in the band A.

The transmission path 52 is an example of the second transmission path, includes a transmission path 52T connecting the transmission/reception terminal 110 and the transmission terminal 132, and a reception path 52R connecting the transmission/reception terminal 110 and the reception terminal 142, and transmits a radio frequency signal in the band B.

The switch 10 is an example of a second switch, includes a common terminal 10a, a selection terminal 10b, and a selection terminal 10c, and switches between conduction and non-conduction between the common terminal 10a and the selection terminal 10b and between conduction and non-conduction between the common terminal 10a and the selection terminal 10c. The common terminal 10a is an example of a second common terminal, the selection terminal 10b is an example of a third selection terminal, and the selection terminal 10c is an example of a fourth selection terminal. The common terminal 10a is connected to the transmission/reception terminal 110, the selection terminal 10b is connected to one end of the transmission path 51, and the selection terminal 10c is connected to one end of the transmission path 52. The switch 10 is an antenna switch that is connected to the primary antenna 2P and that is for selecting a communication band to be transmitted by the primary circuit 1P.

The switch 13 is an example of a third switch, includes a common terminal 13a, a selection terminal 13b, and a selection terminal 13c, and exclusively switches conduction between the common terminal 13a and the selection terminal 13b and conduction between the common terminal 13a and the selection terminal 13c. The common terminal 13a is an example of a third common terminal, the selection terminal 13b is an example of a fifth selection terminal, and the selection terminal 13c is an example of a sixth selection terminal. The switch 13 is a switch for time division duplex (TDD) for switching between the transmission mode and the reception mode for the band B.

The duplexer 11 is configured with a transmission filter 11T whose pass band is a transmission band in the band A, and a reception filter 11R whose pass band is a reception band in the band A. The transmission filter 11T is an example of a third transmission filter, and the reception filter 11R is an example of a third reception filter. An output terminal of the transmission filter 11T and an input terminal of the reception filter 11R are connected to the selection terminal 10b.

The transmission/reception filter 12 is an example of a first transmission/reception filter, and the band B is set as its pass band. The transmission/reception filter 12 is connected between the selection terminal 10c and the common terminal 13a.

The power amplifier 31 amplifies a radio frequency signal in the band A, and is connected between the transmission terminal 131 and the transmission filter 11T.

The power amplifier 32 is an example of a third power amplifier for amplifying a radio frequency signal in the band B, and is connected between the transmission terminal 132 and the selection terminal 13b.

The low-noise amplifier 41 is an example of a fourth low-noise amplifier for amplifying a radio frequency signal in the band A, and is connected between the reception terminal 141 and an output terminal of the reception filter 11R.

The low-noise amplifier 42 is an example of a third low-noise amplifier for amplifying a radio frequency signal in the band B, and is connected between the reception terminal 142 and the selection terminal 13c.

With the duplexer 11 arranged on the transmission path 51, reception of a radio frequency signal in the band A flowing from the transmission/reception terminal 110 to the reception terminal 141, and transmission of a radio frequency signal in the band A flowing from the transmission terminal 131 to the transmission/reception terminal 110 are performed by a frequency division duplex (FDD) system in the transmission path 51.

Also, with the switch 13 and the transmission/reception filter 12 arranged on the transmission path 52, reception of a radio frequency signal in the band B flowing from the transmission/reception terminal 110 to the reception terminal 142, and transmission of a radio frequency signal in the band B flowing from the transmission terminal 132 to the transmission/reception terminal 110 are performed by a TDD system in the transmission path 52.

Note that, in the transmission path 51, a radio frequency signal in the band A may be transmitted by the TDD system. In this case, a switch and a transmission/reception filter may be arranged in place of the duplexer 11.

The diversity circuit 1D includes a reception terminal 120, reception terminals 143 and 144, reception paths 53 and 54, the switch 20, reception filters 21 and 22, and the low-noise amplifiers 43 and 44.

The reception terminal 120 is an example of the first input terminal, the reception terminal 143 is an example of the third reception terminal, and the reception terminal 144 is an example of the fourth reception terminal.

The switch 20 is an example of the first switch, includes a common terminal 20a, a selection terminal 20b, and a selection terminal 20c, and switches between conduction and non-conduction between the common terminal 20a and the selection terminal 20b and between conduction and non-conduction between the common terminal 20a and the selection terminal 20c. The common terminal 20a is an example of the first common terminal, the selection terminal 20b is an example of the first selection terminal, and the selection terminal 20c is an example of the second selection terminal. The common terminal 20a is connected to the reception terminal 120. The switch 20 is an antenna switch that is connected to the diversity antenna 2D and selects a communication band to be transmitted by the diversity circuit 1D.

The reception path 53 is an example of the first reception path, is connected to the selection terminal 20b and the reception terminal 143, and transmits (receives) a radio frequency signal in the band A from the reception terminal 120 to the reception terminal 143 via the selection terminal 20b.

The reception path 54 is an example of the second reception path, is connected to the selection terminal 20c and the reception terminal 144, and transmits (receives) a radio frequency signal in the band B from the reception terminal 120 to the reception terminal 144 via the selection terminal 20c.

The reception filter 21 is an example of a first reception filter, and is connected between the selection terminal 20b and an input terminal of the low-noise amplifier 43, with the band A set as a pass band.

The reception filter 22 is an example of a second reception filter, and is connected between the selection terminal 20c and an input terminal of the low-noise amplifier 44, with the band B set as a pass band.

The low-noise amplifier 43 is an example of a first low-noise amplifier, is arranged on the reception path 53, amplifies a radio frequency signal in the band A input from the reception terminal 120, and outputs the amplified radio frequency signal to the reception terminal 143.

The low-noise amplifier 44 is an example of a second low-noise amplifier, is arranged on the reception path 54, amplifies a radio frequency signal in the band B input from the reception terminal 120, and outputs the amplified radio frequency signal to the reception terminal 144.

Note that although the front-end circuit 1 according to the present embodiment has a configuration in which the primary circuit 1P includes the two transmission paths 51 and 52, the primary circuit 1P may further include a transmission path for transmitting a radio frequency signal in a communication band other than the band A and the band B. In the primary circuit 1P, for example, a transmission path for transmitting a radio frequency signal in a band C may be connected to a selection terminal of the switch 10, or the number of the transmission paths included in the primary circuit 1P may be equal to or more than three. Additionally, either the TDD system or the FDD system may be applied to the transmission path for transmitting a radio frequency signal in the band C. In this case, the front-end circuit 1 can simultaneously transmit radio frequency signals in two or more bands among three or more bands.

Correspondingly, the diversity circuit 1D may have reception paths corresponding to the above-described three or more bands that can be transmitted by the primary circuit 1P. That is, the diversity circuit 1D has a configuration in which the three reception paths corresponding to the above-described three or more bands are connected to the respective selection terminals of the switch 20. In this case, the connection switching of the switch 20 depends on a combination of bands for performing CA in the primary circuit 1P. That is, the connection switching of the switch 20 depends on switching of the switch 10.

It should be noted that the front-end circuit 1 and the communication device 5 according to the present embodiment are applied to a communication system such as 3GPP (Third Generation Partnership Project), and are typically applied to a system for transmitting radio frequency signals of 4G-LTE (Long Term Evolution) and 5G-NR (New Radio). For example, the band 1 (transmission band: 1920 to 1980 MHz, reception band: 2110 to 2170 MHz) of 4G-LTE is applied as the band A, and the band 40 (band: 2300 to 2400 MHz) of 4G-LTE is applied as the band B.

2. Connection State of Front-End Circuit in Response to CA

Figure 2B:
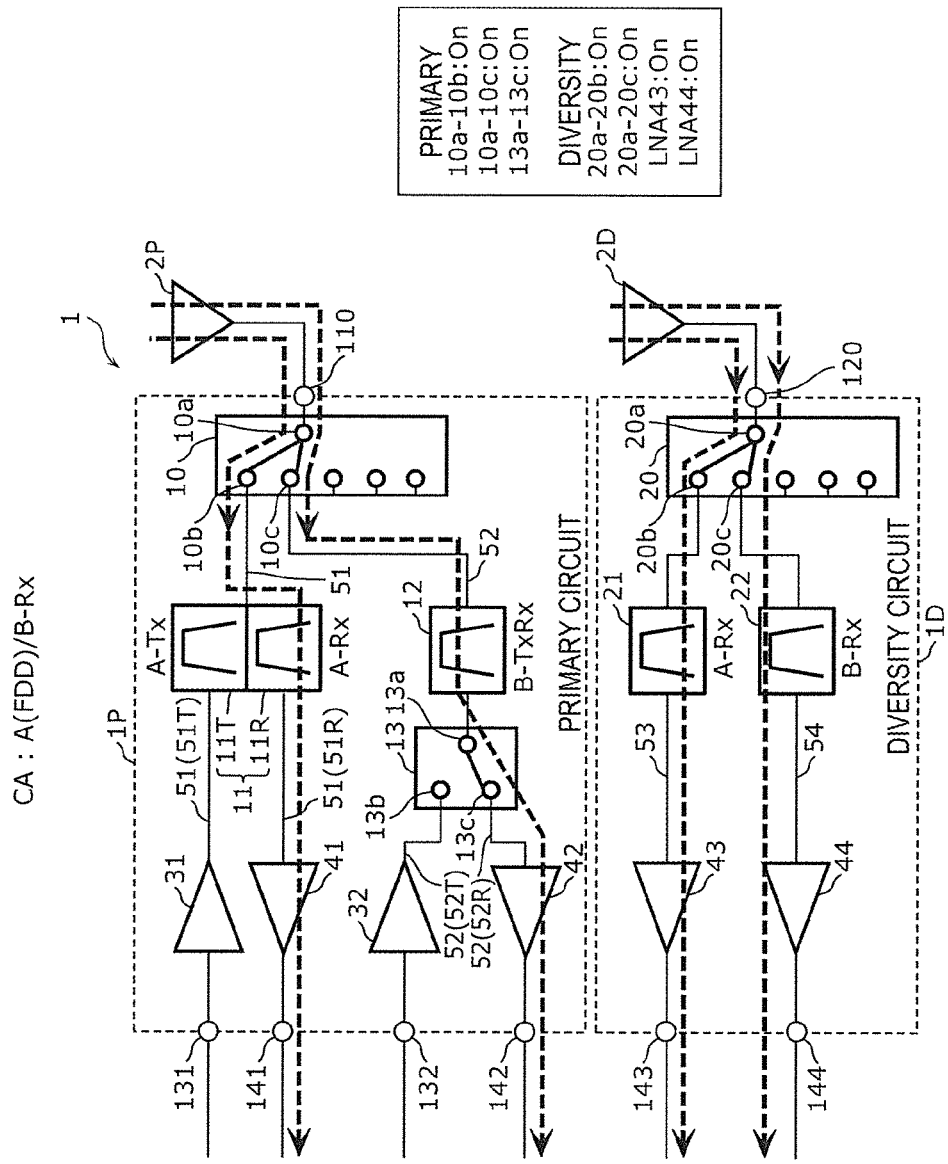
FIG. 2B is a circuit state diagram of the front-end circuit according to the embodiment in a second CA state.

FIG. 2A is a circuit state diagram of the front-end circuit 1 according to the embodiment in a first carrier aggregation (hereinafter referred to as CA) state. FIG. 2B is a circuit state diagram of the front-end circuit 1 according to the embodiment in a second CA state.

The first CA state shown in FIG. 2A is a state in which, in the primary circuit 1P, reception of a radio frequency signal in the band A in the transmission path 51 and transmission of a radio frequency signal in the band B in the transmission path 52 are simultaneously performed. Note that since the FDD system is applied to the transmission path 51, transmission of a radio frequency signal in the band A in the transmission path 51 is also simultaneously performed in the first CA state.

Additionally, the second CA state shown in FIG. 2B is a state in which, in the primary circuit 1P, reception of a radio frequency signal in the band A in the transmission path 51 and reception of a radio frequency signal in the band B in the transmission path 52 are simultaneously performed. Note that since the FDD system is applied to the transmission path 51, transmission of a radio frequency signal in the band A in the transmission path 51 is also simultaneously performed in the second CA state.

As shown in FIG. 2A, in the first CA state, the common terminal 10a and the selection terminal 10b of the switch 10 are in a conductive state, and the common terminal 10a and the selection terminal 10c are in a conductive state in the primary circuit 1P. Further, the common terminal 13a and the selection terminal 13b of the switch 13 are in a conductive state, and the common terminal 13a and the select terminal 13c are in a non-conductive state. On the other hand, in the diversity circuit 1D, the common terminal 20a and the selection terminal 20b of the switch 20 are in a conductive state, and the common terminal 20a and the selection terminal 20c are in a conductive state.

As shown in FIG. 2B, in the second CA state, the common terminal 10a and the selection terminal 10b of the switch 10 are in a conductive state, and the common terminal 10a and the selection terminal 10c are in a conductive state in the primary circuit 1P. Further, the common terminal 13a and the selection terminal 13b of the switch 13 are in a non-conductive state, and the common terminal 13a and the select terminal 13c are in a conductive state. On the other hand, in the diversity circuit 1D, the common terminal 20a and the selection terminal 20b of the switch 20 are in a conductive state, and the common terminal 20a and the selection terminal 20c are in a conductive state.

That is, in the front-end circuit 1 according to the present embodiment, when a radio frequency signal in the band A is received and a radio frequency signal in the band B is received in the primary circuit 1P (the state in FIG. 2B), both of the reception path 53 for the band A and the reception path 54 for the band B are connected to the reception terminal 120 in the diversity circuit 1D. Further, even when a radio frequency signal in the band A is received and a radio frequency signal in the band B is not received (the state in FIG. 2A) in the primary circuit 1P, both of the reception path 53 for the band A and the reception path 54 for the band B are connected to the reception terminal 120 in the diversity circuit 1D.

The characteristic configuration described above of the switching connection of the diversity circuit 1D included in the front-end circuit 1 according to the present embodiment is compared with a configuration of switching connection of a front-end circuit 500 according to a comparative example that is generally assumed and the configuration is described below.

Figure 3A:
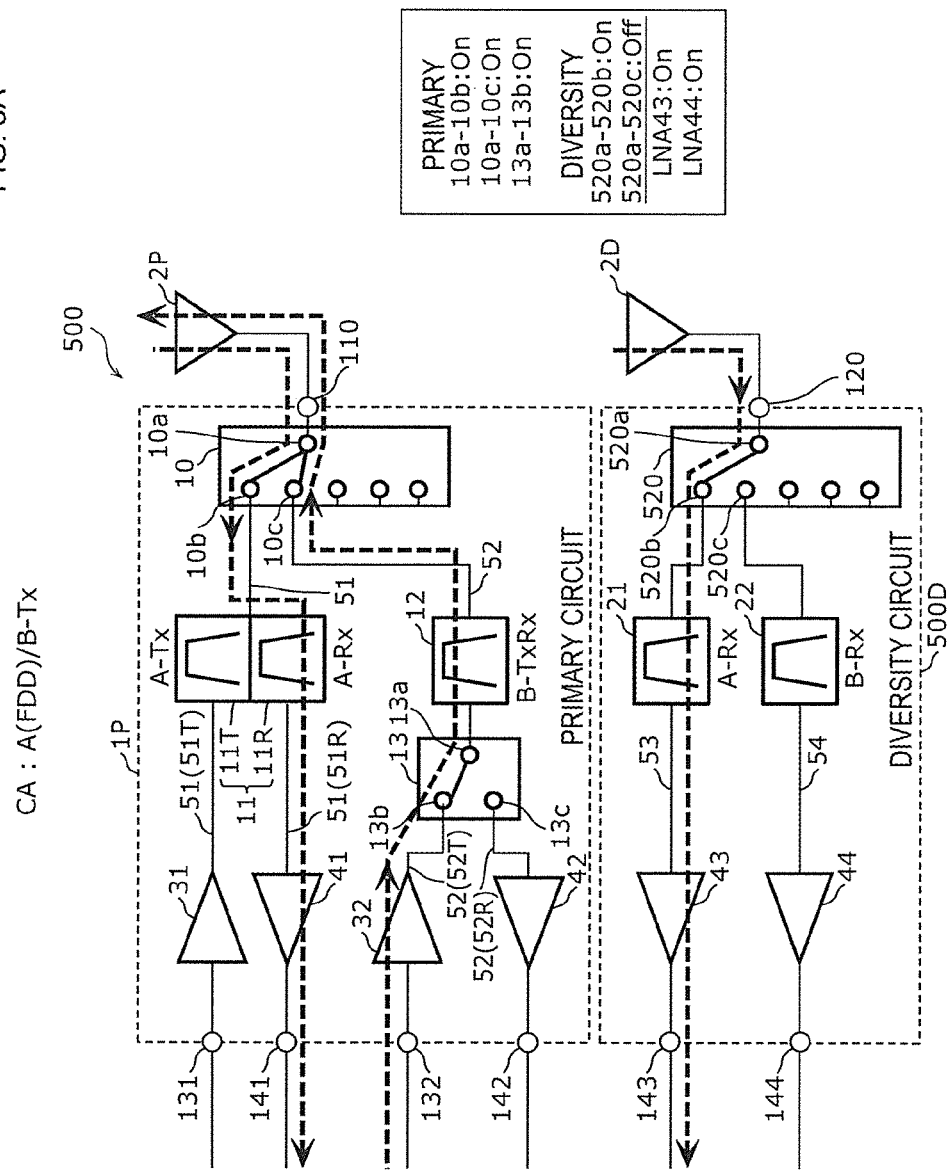
FIG. 3A is a circuit state diagram of a front-end circuit according to a comparative example in the first CA state.
Figure 3B:
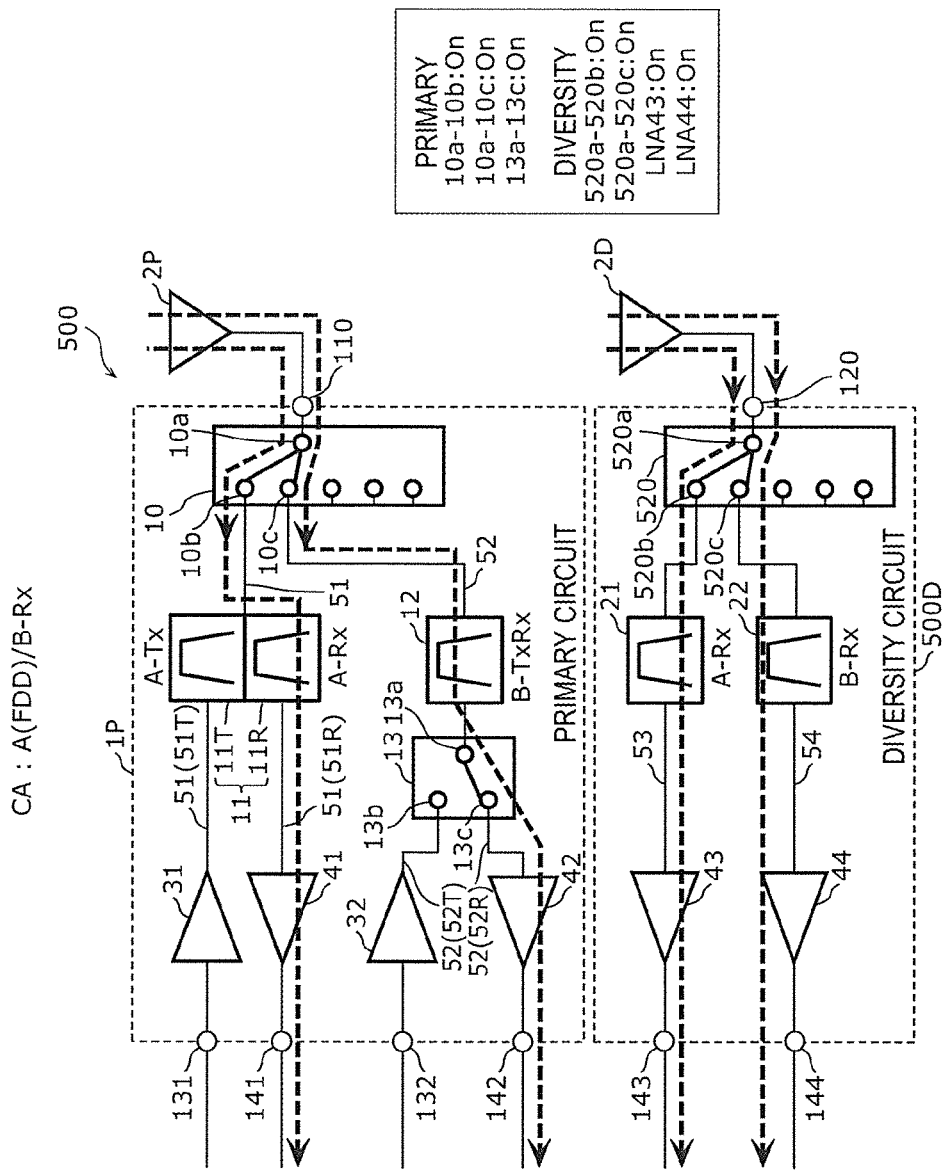
FIG. 3B is a circuit state diagram of the front-end circuit according to the comparative example in the second CA state.

FIG. 3A is a circuit state diagram of the front-end circuit 500 according to the comparative example in the first CA state. FIG. 3B is a circuit state diagram of the front-end circuit 500 according to the comparative example in the second CA state.

The first CA state shown in FIG. 3A is the same state as the first CA state shown in FIG. 2A, and the second CA state shown in FIG. 3B is the same state as the second CA state shown in FIG. 2B.

The front-end circuit 500 according to the comparative example includes the primary circuit 1P and a diversity circuit 500D. The front-end circuit 500 according to the comparative example includes the primary circuit 1P having the same configuration as the primary circuit included in the front-end circuit 1 according to the embodiment, but includes the diversity circuit 500D having a different configuration from the diversity circuit included in the front-end circuit 1 according to the embodiment. Hereinafter, the front-end circuit 500 according to the comparative example will be described mainly with respect to a point different from the front-end circuit 1 according to the embodiment.

The diversity circuit 500D includes the reception terminal 120, the reception terminals 143 and 144, the reception paths 53 and 54, a switch 520, the reception filters 21 and 22, and the low-noise amplifiers 43 and 44.

The switch 520 includes a common terminal 520a, and selection terminals 520b and 520c, and switches between conduction and non-conduction between the common terminal 520a and the selection terminal 520b and between conduction and non-conduction between the common terminal 520a and the selection terminal 520c.

The reception path 53 is connected to the selection terminal 520b and the reception terminal 143, and transmits (receives) a radio frequency signal in the band A from the reception terminal 120 to the reception terminal 143 via the selection terminal 520b. The reception path 54 is connected to the selection terminal 520c and the reception terminal 144, and transmits (receives) a radio frequency signal in the band B from the reception terminal 120 to the reception terminal 144 via the selection terminal 520c.

The reception filter 21 is connected between the selection terminal 520b and the input terminal of the low-noise amplifier 43, with the band A set as a pass band. The reception filter 22 is connected between the selection terminal 520c and the input terminal of the low-noise amplifier 44, with the band B set as a pass band.

As shown in FIG. 3A, in the first CA state, the common terminal 10a and the selection terminal 10b of the switch 10 are in a conductive state, and the common terminal 10a and the selection terminal 10c are in a conductive state in the primary circuit 1P. Further, the common terminal 13a and the selection terminal 13b of the switch 13 are in a conductive state, and the common terminal 13a and the select terminal 13c are in a non-conductive state. On the other hand, in the diversity circuit 500D, the common terminal 520a and the selection terminal 520b of the switch 520 are in a conductive state, and the common terminal 520a and the selection terminal 520c are in a non-conductive state.

As shown in FIG. 3B, in the second CA state, the common terminal 10a and the selection terminal 10b of the switch 10 are in a conductive state, and the common terminal 10a and the selection terminal 10c are in a conductive state in the primary circuit 1P. Further, the common terminal 13a and the selection terminal 13b of the switch 13 are in a non-conductive state, and the common terminal 13a and the select terminal 13c are in a conductive state. On the other hand, in the diversity circuit 500D, the common terminal 520a and the selection terminal 520b of the switch 520 are in a conductive state, and the common terminal 520a and the selection terminal 520c are in a conductive state.

That is, in the front-end circuit 500 according to the comparative example, when a radio frequency signal in the band A is received and a radio frequency signal in the band B is received in the primary circuit 1P (the state in FIG. 3B), both of the reception path 53 for the band A and the reception path 54 for the band B are connected to the reception terminal 120 in the diversity circuit 500D. On the other hand, when a radio frequency signal in the band A is received and a radio frequency signal in the band B is not received in the primary circuit 1P (the state in FIG. 3A), the reception path 53 for the band A is connected to the reception terminal 120, but the reception path 54 for the band B is not connected to the reception terminal 120 in the diversity circuit 500D.

In the front-end circuit 500 according to the comparative example, a connection state of the switch 520 included in the diversity circuit 500D also changes in response to switching between a transmission mode and a reception mode of a radio frequency signal in the band B in the primary circuit 1P. Accordingly, phases of radio frequency signals in the band A which always pass through the transmission path 51 from the reception terminal 120 to the reception terminal 143 without necessarily being time-divided because of the FDD system change every time the connection state of the switch 520 changes in response to the switching between the transmission mode and the reception mode of radio frequency signals in the band B. When a phase of a radio frequency signal in the band A in the diversity circuit 500D changes, an error vector magnitude (hereinafter referred to as EVM) which is one kind of signal quality of a digital signal to be detected in the RFIC 3 and the BBIC 4 deteriorates. As a result, for example, a constellation representing identification accuracy of a digital signal deteriorates, and there may be a possibility that the communication device 5 can not accurately acquire (receive) data information included in a radio frequency signal in the band A.

In contrast, in the front-end circuit 1 according to the present embodiment, a connection state of the switch 20 included in the diversity circuit 1D does not depend on the switching between the transmission mode and the reception mode of a radio frequency signal in the band B in the primary circuit 1P, but is kept constant. Thus, phases of radio frequency signals in the band A always passing through the reception path 53 from the reception terminal 120 to the reception terminal 143 without necessarily being time-divided by the FDD system do not change due to the switching between the transmission mode and the reception mode of radio frequency signals in the band B. Thus, since an EVM does not deteriorate and a constellation also does not deteriorate, data information included in radio frequency signals in the band A can be accurately acquired (received).

That is, according to the front-end circuit 1 according to the present embodiment, a reception signal can be received with high accuracy in a system including a primary circuit and a diversity circuit capable of simultaneously transmitting radio frequency signals in a plurality of communication bands.

Note that, as shown in FIG. 2B, when reception of a radio frequency signal in the band A in the transmission path 51 in the primary circuit 1P and reception of a radio frequency signal in the band B in the transmission path 52 in the primary circuit 1P are simultaneously performed, the low-noise amplifiers 43 and 44 in the diversity circuit 1D are in an amplification operation state. On the other hand, as shown in FIG. 2A, when reception of a radio frequency signal in the band A in the transmission path 51 in the primary circuit 1P and transmission of a radio frequency signal in the band B in the transmission path 52 in the primary circuit 1P are simultaneously performed, the low-noise amplifier 43 in the diversity circuit 1D may be set in the amplification operation state, and the low-noise amplifier 44 may be set in an amplification stop state.

When transmission of a radio frequency signal in the band B is performed in the transmission path 52 in the primary circuit 1P, an amplification operation of the low-noise amplifier 44 in the diversity circuit 1D is not necessary. Therefore, when the transmission of the radio frequency signal in the band B is performed in the transmission path 52, current consumption of the low-noise amplifier 44 can be reduced, and reduction in power consumption of the front-end circuit 1 can be promoted.

That is, switching between the amplification operation state and the amplification stop state of the low-noise amplifier 44 depends on switching between the transmission mode and the reception mode of a radio frequency signal in the band B in the primary circuit 1P, but does not depend on the connection switching of the switch 20.

On the other hand, the connection switching of the switch 20 does not depend on the switching between a transmission mode and a reception mode in the transmission path by the TDD system in the primary circuit 1P, but depends on the combination of the bands in which the CA is performed in the primary circuit 1P.

3. Effect and the Like

As described above, according to the present embodiment, the front-end circuit 1 includes the primary circuit 1P capable of simultaneously transmitting at least a radio frequency signal in the band A and a radio frequency signal in the band B, and the diversity circuit 1D configured to receive a radio frequency signal in the band A in response to reception of a radio frequency signal in the band A in the primary circuit 1P, and configured to receive a radio frequency signal in the band B in response to reception of a radio frequency signal in the band B in the primary circuit 1P. The primary circuit 1P includes the transmission/reception terminal 110, the reception terminals 141 and 142 and the transmission terminal 132, the transmission path 51 connecting the transmission/reception terminal 110 and the reception terminal 141 to transmit a radio frequency signal in the band A, and the transmission path 52 connecting the transmission/reception terminal 110, the reception terminal 142, and the transmission terminal 132 to transmit a radio frequency signal in the band B. In the transmission path 52, reception of a radio frequency signal in the band B flowing from the transmission/reception terminal 110 to the reception terminal 142 and transmission of a radio frequency signal in the band B flowing from the transmission terminal 132 to the transmission/reception terminal 110 are performed by using the TDD system. The diversity circuit 1D includes the reception terminals 120, 143, and 144, the common terminal 20a connected to the selection terminals 20b and 20c and the reception terminal 120, the switch 20 for switching between conduction and non-conduction between the common terminal 20a and the selection terminal 20b and switching between conduction and non-conduction between the common terminal 20a and the selection terminal 20c, the reception path 53 connected to the selection terminal 20b and the reception terminal 143 and configured to receive a radio frequency signal in the band A from the reception terminal 120 through the selection terminal 20b to the reception terminal 143, and the reception path 54 connected to the selection terminal 20c and the reception terminal 144 and configured to receive a radio frequency signal in the band B from the reception terminal 120 through the selection terminal 20c to the reception terminal 144. When reception of a radio frequency signal in the band A in the transmission path 51 and reception of a radio frequency signal in the band B in the transmission path 52 are simultaneously performed in the primary circuit 1P, the switch 20 causes the common terminal 20a and the selection terminal 20b to be in a conductive state, and causes the common terminal 20a and the selection terminal 20c to be in a conductive state. In addition, when reception of a radio frequency signal in the band A in the transmission path 51 and transmission of a radio frequency signal in the band B in the transmission path 52 are simultaneously performed in the primary circuit 1P, the switch 20 causes the common terminal 20a and the selection terminal 20b to be in a conductive state, and causes the common terminal 20a and the selection terminal 20c to be in a conductive state.

Thus, a phase of a radio frequency signal in the band A passing from the reception terminal 120 to the reception terminal 143 in the reception path 53 does not change due to the switching between the transmission mode and the reception mode of a radio frequency signal in the band B. Thus, since an EVM does not deteriorate and a constellation does not deteriorate, data information included in radio frequency signals in the band A can be accurately acquired. That is, in the system including the primary circuit 1P and the diversity circuit 1D capable of simultaneously transmitting radio frequency signals in the plurality of communication bands, it is possible to receive a reception signal with high accuracy.

Furthermore, according to the present embodiment, the diversity circuit 1D may further include the low-noise amplifier 43 arranged on the reception path 53 and amplifying a radio frequency signal in the band A input from the reception terminal 120 to output the amplified radio frequency signal to the reception terminal 143, and the low-noise amplifier 44 arranged on the reception path 54 and amplifying a radio frequency signal in the band B input from the reception terminal 120 to output the amplified radio frequency signal to the reception terminal 144, in which when reception of a radio frequency signal in the band A in the transmission path 51 and reception of a radio frequency signal in the band B in the transmission path 52 are simultaneously performed in the primary circuit 1P, the low-noise amplifiers 43 and 44 may be in an amplification operation state, and when reception of a radio frequency signal in the band A in the transmission path 51 and transmission of a radio frequency signal in the band B in the transmission path 52 are simultaneously performed in the primary circuit 1P, the low-noise amplifier 43 may be in an amplification operation state and the low-noise amplifier 44 may be in an amplification stop state.

Thus, when the transmission of the radio frequency signal in the band B is performed in the transmission path 52, current consumption of the low-noise amplifier 44 can be reduced, and the reduction in power consumption of the front-end circuit 1 can be promoted.

Further, according to the present embodiment, the diversity circuit 1D may further include the reception filter 21 connected between the selection terminal 20b and the input terminal of the low-noise amplifier 43 with the band A set as a passband, and the reception filter 22 connected between the selection terminal 20c and the input terminal of the low-noise amplifier 44 with the band B as a pass band.

Thus, the diversity circuit 1D can output a reception signal in which noise is reduced. Moreover, impedance when a reception terminal 143 side or 144 side is viewed from the switch 20 does not depend on the switching between the amplification operation state and the amplification stop state of the low-noise amplifiers 43 and 44, but can be kept constant.

Further, according to the present embodiment, the primary circuit 1P may further include the common terminal 10a, the selection terminal 10b and the selection terminal 10c, and the switch 10 for switching between conduction and non-conduction between the common terminal 10a and the selection terminal 10b, and switching between conduction and non-conduction between the common terminal 10a and the selection terminal 10c, in which the common terminal 10a may be connected to the transmission/reception terminal 110, the selection terminal 10b may be connected to one end of the transmission path 51, and the selection terminal 10c may be connected to one end of the transmission path 52.

Thus, isolation between the transmission path 51 and the transmission path 52 can be improved, so that single transmission of a radio frequency signal in the band A in the transmission path 51, single transmission of a radio frequency signal in the band B in the transmission path 52, and simultaneous transmission of a radio frequency signal in the band A in the transmission path 51 and a radio frequency signal in the band B in the transmission path 52 can be performed with high accuracy.

Additionally, according to the present embodiment, the primary circuit 1P may further include the common terminal 13a, the selection terminals 13b and 13c, the switch 13 for exclusively switching conduction between the common terminal 13a and the selection terminal 13b and conduction between the common terminal 13a and the selection terminal 13c, the transmission/reception filter 12 connected between the selection terminal 10c and the common terminal 13a with the band B set as a pass band, the power amplifier 32 that is connected between the transmission terminal 132 and the selection terminal 13b and that amplifies a radio frequency signal in the band B, and the low-noise amplifier 42 that is connected between the selection terminal 13c and the reception terminal 142 and that amplifies a radio frequency signal in the band B.

According to this configuration, the transmission path 52 can be applied for the TDD system with a simplified circuit configuration.

Furthermore, according to the present embodiment, the primary circuit 1P may include the transmission filter 11T set the transmission band in the band A as a pass band, the reception filter 11R set the reception band in the band A as a pass band, the power amplifier 31 that is connected to an input terminal of the transmission filter 11T and that amplifies a radio frequency signal in the band A, and the low-noise amplifier 41 that is connected between the reception terminal 141 and the output terminal of the reception filter 11R and that amplifies a radio frequency signal in the band A, in which the output terminal of the transmission filter 11T and the input terminal of the reception filter 11R may be connected to the selection terminal 10b.

According to this configuration, the transmission path 51 can be applied for the FDD system with a simplified circuit configuration.

Moreover, according to the present embodiment, the band A may be the band 1 of LTE, and the band B may be the band 40 of LTE.

As a result, CA between a radio frequency signal in the band 1 applied to the FDD system of 4G LTE and a radio frequency signal in the band 40 applied to the TDD system of 4G LTE can be performed.

Note that the present disclosure is not limited to the front-end circuit including the primary circuit 1P and the diversity circuit 1D, but may be the diversity circuit 1D alone. That is, the diversity circuit 1D according to the present disclosure receives a radio frequency signal in the band A in response to reception of a radio frequency signal in the band A in the primary circuit 1P capable of transmitting at least a radio frequency signal in the band A and a radio frequency signal in the band B, and receives a radio frequency signal in the band B in response to reception of a radio frequency signal in the band B in the primary circuit 1P. The diversity circuit 1D includes the reception terminals 120, 143, and 144, the switch 20 that includes the selection terminals 20b and 20c, and the common terminal 20a connected to the reception terminal 120 and that switches between conduction and non-conduction between the common terminal 20a and the common terminal 20b and between conduction and non-conduction between the common terminal 20a and the selection terminal 20c, the reception path 53 that is connected to the selection terminal 20b and the reception terminal 143 and that receives a radio frequency signal in the band A from the reception terminal 120 to the reception terminal 143 via the selection terminal 20b, and the reception path 54 that is connected to the selection terminal 20c and the reception terminal 144 and that receives a radio frequency signal in the band B from the reception terminal 120 to the reception terminal 144 via the selection terminal 20c, in which when reception of a radio frequency signal in the band A and reception of a radio frequency signal in the band B are simultaneously performed in the primary circuit 1P, the switch 20 causes the common terminal 20a and the selection terminal 20b to be in a conductive state and causes the common terminal 20a and the selection terminal 20c to be in a conductive state, and when reception of a radio frequency signal in the band A and transmission of a radio frequency signal in the band B are simultaneously performed in the primary circuit 1P, the switch 20 causes the common terminal 20a and the selection terminal 20b to be in a conductive state and the common terminal 20a and the selection terminal 20c to be in a conductive state.

According to this, a phase of a radio frequency signal in the band A passing through the reception path 53 from the reception terminal 120 to the reception terminal 143 does not change due to the switching between the transmission mode and the reception mode of a radio frequency signal in the band B. Thus, since an EVM does not deteriorate and a constellation does not deteriorate, data information included in radio frequency signals in the band A can be accurately acquired. That is, in the system including the diversity circuit 1D, it is possible to receive a reception signal with high accuracy.

According to the present embodiment, the communication device 5 can include the RFIC 3 for processing a radio frequency signal to be transmitted and a radio frequency signal received by an antenna circuit, and the front-end circuit 1 or the diversity circuit 1D for transmitting a radio frequency signal between the antenna circuit and the RFIC 3.

Thus, in the system including the primary circuit 1P and the diversity circuit 1D capable of simultaneously transmitting radio frequency signals in a plurality of communication bands, it is possible to provide the communication device 5 configured to receive a reception signal with high accuracy.

According to the present embodiment, the communication device 5 can include the RFIC 3 for processing a radio frequency signal to be transmitted and a radio frequency signal to be received by the antenna circuit, and the front-end circuit 1 for transmitting a radio frequency signal between the antenna circuit and the RFIC 3, in which the antenna circuit can include the primary antenna 2P connected to the transmission/reception terminal 110 and the diversity antenna 2D connected to the reception terminal 120.

Thus, in the system including the primary circuit 1P and the diversity circuit 1D capable of simultaneously transmitting radio frequency signals in a plurality of communication bands, it is possible to provide the communication device 5 configured to receive a reception signal with high accuracy.

Further, the communication device 5 according to the present embodiment may further include a control unit for controlling connection switching operations of the switches 10, 13, and 20 and switching operations between the amplification operation and the amplification stop of the low-noise amplifiers 41 to 44 and the power amplifiers 31 and 32.

Here, the control unit connects the common terminal 10a and the selection terminal 10b and connects the common terminal 10a and the selection terminal 10c of the switch 10, connects the common terminal 13a and the selection terminal 13c of the switch 13, and connects the common terminal 20a and the selection terminal 20b and connects the common terminal 20a and the selection terminal 20c of the switch 20. Further, the control unit connects the common terminal 10a and the selection terminal 10b and connects the common terminal 10a and the selection terminal 10c of the switch 10, connects the common terminal 13a and the selection terminal 13b of the switch 13, and connects the common terminal 20a and the selection terminal 20b and connects the common terminal 20a and the selection terminal 20c of the switch 20. According to the above control by the control unit, the connection state of the switch 20 included in the diversity circuit 1D does not depend on the switching between the transmission mode and the reception mode of a radio frequency signal in the band B in the primary circuit 1P, but becomes constant. Thus, phases of radio frequency signals in the band A always passing through the reception path 53 from the reception terminal 120 to the reception terminal 143 without necessarily being time-divided by the FDD system do not change due to the switching between the transmission mode and the reception mode of radio frequency signals in the band B. Thus, since an EVM does not deteriorate and a constellation does not deteriorate, the communication device 5 can accurately acquire data information included in radio frequency signals in the band A.

Also, the control unit connects the common terminal 10a and the selection terminal 10b and connects the common terminal 10a and the selection terminal 10c of the switch 10, connects the common terminal 13a and the selection terminal 13c of the switch 13, connects the common terminal 20a and the selection terminal 20b and connects the common terminal 20a and the selection terminal 20c of the switch 20, and causes the low-noise amplifier 44 to perform the amplification operation. Also, the control unit connects the common terminal 10a and the selection terminal 10b and connects the common terminal 10a and the selection terminal 10c of the switch 10, connects the common terminal 13a and the selection terminal 13b of the switch 13, connects the common terminal 20a and the selection terminal 20b and connects the common terminal 20a and the selection terminal 20c of the switch 20, and causes the low-noise amplifier 44 to stop the amplification operation. Thus, when transmission of a radio frequency signal in the band B is performed in the reception path 54, current consumption of the low-noise amplifier 44 can be reduced, and reduction in power consumption of the front-end circuit 1 can be promoted.

Other Embodiments

Although the front-end circuit and the communication device according to the embodiment have been described above, the front-end circuit and the communication device according to the present disclosure are not limited to the embodiment described above. Other embodiments which are achieved by combining any constituent elements in the above embodiment, modifications which can be obtained by applying various changes conceivable by those skilled in the art without necessarily departing from the gist of the present disclosure with respect to the above embodiment, and various devices incorporating the front-end circuit and the communication device according to the above embodiment are also included in the present disclosure.

For example, in the front-end circuit and the communication device according to the above embodiment, another radio frequency circuit element, wiring, or the like may be inserted between each of the circuit elements and the path connecting the signal paths disclosed in the drawings.

INDUSTRIAL AVAILABILITY

The present disclosure is widely applicable to communication devices such as mobile phones as front-end circuits corresponding to multi-band/multi-mode and employing a carrier aggregation method.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A front-end circuit comprising:
a primary circuit configured to simultaneously transmit a first radio frequency signal in a first communication band and a second radio frequency signal in a second communication band, and configured to receive the first radio frequency signal and the second radio frequency signal; and
a diversity circuit configured to receive a third radio frequency signal in the first communication band in response to reception of the first radio frequency signal in the primary circuit, and configured to receive a fourth radio frequency signal in the second communication band in response to reception of the second radio frequency signal in the primary circuit, wherein:
the primary circuit comprises:
a first input/output terminal, a first reception terminal, a second reception terminal, and a second transmission terminal;
a first signal path connecting the first input/output terminal and the first reception terminal, and configured to pass the first radio frequency signal; and
a second signal path connecting the first input/output terminal, the second reception terminal, and the second transmission terminal, and configured to pass the second radio frequency signal,
in the second signal path, reception of the second radio frequency signal from the first input/output terminal to the second reception terminal, and transmission of the second radio frequency signal from the second transmission terminal to the first input/output terminal, are performed by time division duplexing,
the diversity circuit comprises:
a first input terminal, a third reception terminal and a fourth reception terminal,
a first switch comprising a first selection terminal, a second selection terminal, and a first common terminal, the first common terminal being connected to the first input terminal, and the first switch being configured to selectively connect the first common terminal to the first selection terminal and to the second selection terminal,
a first reception path connecting the first selection terminal and the third reception terminal, and configured to pass the third radio frequency signal from the first input terminal to the third reception terminal via the first selection terminal, and
a second reception path connecting the second selection terminal and the fourth reception terminal, and configured to pass the fourth radio frequency signal from the first input terminal to the fourth reception terminal via the second selection terminal,
when the first radio frequency signal in the first signal path is simultaneously received with reception of the second radio frequency signal in the second signal path, the first switch is configured to connect the first common terminal to the first selection terminal and to the second selection terminal, and
when the first radio frequency signal in the first signal path is received simultaneously with transmission of the second radio frequency signal in the second signal path, the first switch is configured to connect the first common terminal to the first selection terminal and to the second selection terminal,
wherein the first switch is not connected to the primary circuit.

2. The front-end circuit according to claim 1, wherein:
the diversity circuit further comprises:
a first low-noise amplifier in the first reception path that is configured to amplify the third radio frequency signal input from the first input terminal, and to output the amplified third radio frequency signal to the third reception terminal; and a second low-noise amplifier in the second reception path that is configured to amplify the fourth radio frequency signal input from the first input terminal, and to output the amplified fourth radio frequency signal to the fourth reception terminal, when the first radio frequency signal is simultaneously received with the second radio frequency signal in the second signal path, the first low-noise amplifier and the second low-noise amplifier are in an amplification operation state, and when the first radio frequency signal in the first signal path is received simultaneously with transmission of the second radio frequency signal in the second signal path, the first low-noise amplifier is in an amplification operation state and the second low-noise amplifier is in an amplification stop state.

3. The front-end circuit according to claim 2, wherein the diversity circuit further comprises:

a first reception filter connected between the first selection terminal and an input terminal of the first low-noise amplifier, the first communication band being a pass band of the first reception filter; and a second reception filter connected between the second selection terminal and an input terminal of the second low-noise amplifier, the second communication band being a pass band of the second reception filter.

4. The front-end circuit according to claim 1, wherein:

the primary circuit further comprises a second switch comprising a second common terminal, a third selection terminal, and a fourth selection terminal, the second switch being configured to selectively connect the second common terminal and to the third selection terminal to the fourth selection terminal, the second common terminal is connected to the first input/output terminal, the third selection terminal is connected to an end of the first signal path, and the fourth selection terminal is connected to an end of the second signal path.

5. The front-end circuit according to claim 4, wherein the primary circuit further comprises:

a third switch comprising a third common terminal, a fifth selection terminal, and a sixth selection terminal, the third switch being configured to exclusively selectively connect the third common terminal to the fifth selection terminal or to the sixth selection terminal;

a first transmission/reception filter connected between the fourth selection terminal and the third common terminal, the second communication band being a pass band of the first transmission/reception filter;

a third power amplifier connected between the second transmission terminal and the fifth selection terminal, and configured to amplify the second radio frequency signal; and a third low-noise amplifier connected between the sixth selection terminal and the second reception terminal, and configured to amplify the second radio frequency signal.

6. The front-end circuit according to claim 4, wherein:

the primary circuit further comprises:

a third transmission filter, the first communication band being a pass band of the third transmission filter;

a third reception filter, the first communication band being a pass band of the third reception filter;

a fourth power amplifier connected to an input terminal of the third transmission filter, and configured to amplify the first radio frequency signal; and a fourth low-noise amplifier connected between the first reception terminal and an output terminal of the third reception filter, and configured to amplify the first radio frequency signal, and an output terminal of the third transmission filter and an input terminal of the third reception filter are connected to the third selection terminal.

7. The front-end circuit according to claim 1, wherein:

the first communication band is Band 1 of a long term evolution (LTE) communication protocol, and the second communication band is Band 40 of the LTE protocol.

8. A diversity circuit configured to receive a third radio frequency signal in a first communication band in response to reception of a first radio frequency signal in the first communication band in a primary circuit, and configured to receive a fourth radio frequency signal in a second communication band in response to reception of a second radio frequency signal in the second communication band in the primary circuit, the primary circuit being configured to transmit and receive the first radio frequency signal and the second radio frequency signal, the diversity circuit comprising:

a first input terminal, a third reception terminal and a fourth reception terminal;

a first switch comprising a first selection terminal, a second selection terminal, and a first common terminal connected to the first input terminal, the first switch being configured to selectively connect the first common terminal to the first selection terminal and to the second selection terminal;

a first reception path connecting the first selection terminal and the third reception terminal, the first reception path being configured to pass the third radio frequency signal from the first input terminal to the third reception terminal via the first selection terminal; and a second reception path connecting the second selection terminal and the fourth reception terminal, the second reception path being configured to pass the fourth radio frequency signal from the first input terminal to the fourth reception terminal via the second selection terminal, wherein:

when the first radio frequency signal and the second radio frequency signal are simultaneously received, the first switch is configured to connect the first common terminal to the first selection terminal and to the second selection terminal, and when the first radio frequency signal is simultaneously received with transmission of the second radio frequency signal, the first switch is configured to connect the first common terminal to the first selection terminal and to the second selection terminal, wherein the first switch is not connected to the primary circuit.

9. A communication device comprising:

a radio frequency (RF) signal processing circuit configured to process radio frequency signals transmitted and received by an antenna circuit; and the front-end circuit according to claim 1, the front-end circuit being configured to transmit the radio frequency signals between the antenna circuit and the RF signal processing circuit.

10. A communication device comprising:
a radio frequency (RF) signal processing circuit configured to process radio frequency signals transmitted and received by an antenna circuit; and
the diversity circuit according to claim 8, the diversity circuit being configured to transmit the radio frequency signals between the antenna circuit and the RF signal processing circuit.

11. A communication device comprising:
a radio frequency (RF) signal processing circuit configured to process radio frequency signals transmitted and received by an antenna circuit; and
the front-end circuit according to claim 1, the front-end circuit being configured to transmit the radio frequency signals between the antenna circuit and the RF signal processing circuit,
wherein the antenna circuit comprises:
  a primary antenna connected to the first input/output terminal; and
  a diversity antenna connected to the first input terminal.

* * * * *